(12) United States Patent
Zhuang et al.

(10) Patent No.: US 12,494,784 B2
(45) Date of Patent: Dec. 9, 2025

(54) SYSTEM AND METHODS FOR PARAMETRICALLY-MODULATED SUPERCONDUCTING NON-RECIPROCAL COMPONENTS BASED ON COUPLED RESONATORS

(71) Applicant: Washington University, St. Louis, MO (US)

(72) Inventors: Yi Zhuang, St. Louis, MO (US); Chandrashekhar Gaikwad, St. Louis, MO (US); Daria Kowsari, St. Louis, MO (US); Kater Murch, St. Louis, MO (US); Aravind Nagulu, St. Louis, MO (US)

(73) Assignee: Washington University, St. Louis, MO (US)

( * ) Notice: Subject to any disclaimer, the term of this patent is extended or adjusted under 35 U.S.C. 154(b) by 34 days.

(21) Appl. No.: 18/442,474

(22) Filed: Feb. 15, 2024

(65) Prior Publication Data
US 2025/0080112 A1    Mar. 6, 2025

Related U.S. Application Data

(60) Provisional application No. 63/485,411, filed on Feb. 16, 2023.

(51) Int. Cl.
| H03K 17/92 | (2006.01) |
| H03H 3/00 | (2006.01) |
| H03H 11/04 | (2006.01) |

(52) U.S. Cl.
CPC ............... *H03K 17/92* (2013.01); *H03H 3/00* (2013.01); *H03H 11/04* (2013.01)

(58) Field of Classification Search
CPC ......... H03K 19/195; H03K 17/92; H03K 3/38
See application file for complete search history.

(56) References Cited

U.S. PATENT DOCUMENTS

| 7,863,892 | B2 | 1/2011 | Morley et al. |
| 8,138,784 | B2 | 3/2012 | Przybysz et al. |
| 8,983,303 | B2 | 3/2015 | Meyers et al. |
| 9,438,246 | B1 * | 9/2016 | Naaman ................. G11C 11/44 |
| 9,691,962 | B2 | 6/2017 | Abdo |
| 9,893,262 | B2 | 2/2018 | Thompson et al. |
| 9,923,538 | B2 | 3/2018 | Abdo |
| 9,928,948 | B2 | 3/2018 | Naaman et al. |
| 10,050,630 | B2 | 8/2018 | Reagor et al. |
| 10,171,077 | B2 | 1/2019 | Abdo et al. |
| 10,686,115 | B2 | 6/2020 | Abdo |
| 11,108,398 | B2 | 8/2021 | Sete et al. |
| 11,139,903 | B2 | 10/2021 | Abdo |

(Continued)

FOREIGN PATENT DOCUMENTS

| WO | 2019033140 A1 | 2/2019 |
| WO | WO-2022115278 A1 * | 6/2022 ............. G06N 10/40 |

*Primary Examiner* — Daniel C Puentes
(74) *Attorney, Agent, or Firm* — Armstrong Teasdale LLP (57) ABSTRACT

A device for implementing a non-reciprocal bandpass filter is provided. The device includes a plurality of capacitively-coupled shunt resonators. Each capacitively-coupled shunt resonators includes a plurality of superconducting quantum interference devices (SQUIDs) connected to each other, a flux line inductively coupled to the plurality of SQUIDs, and a capacitor connected in parallel to the plurality of SQUIDs.

20 Claims, 8 Drawing Sheets

(56) References Cited

U.S. PATENT DOCUMENTS

| | | |
|---|---|---|
| 2005/0084031 A1 | 4/2005 | Rosen et al. |
| 2005/0084032 A1 | 4/2005 | Rosen et al. |
| 2005/0084033 A1 | 4/2005 | Rosen et al. |
| 2005/0100076 A1 | 5/2005 | Gazdzinski et al. |
| 2012/0212375 A1 | 8/2012 | Depree, IV |
| 2019/0156238 A1* | 5/2019 | Abdo ............... H03K 17/92 |
| 2020/0050961 A1* | 2/2020 | Abdo ............ H10N 60/0912 |
| 2022/0052662 A1 | 2/2022 | White et al. |
| 2022/0158626 A1 | 5/2022 | Chakraborty et al. |

* cited by examiner

SYSTEM AND METHODS FOR PARAMETRICALLY-MODULATED SUPERCONDUCTING NON-RECIPROCAL COMPONENTS BASED ON COUPLED RESONATORS

CROSS REFERENCE TO RELATED APPLICATION

This application claims priority to U.S. Provisional Patent Application No. 63/485,411, filed Feb. 16, 2024, which is hereby incorporated by reference in its entirety.

BACKGROUND

The field of the invention relates generally to superconducting non-reciprocal components, and more specifically, to parametrically-modulated superconducting non-reciprocal components based on coupled resonators.

Quantum computers show promise to solve certain computational problems exponentially faster than a classical computer due to the superposition and entanglement properties of qubits. Current state-of-the-art quantum computers employ only a few 10's of qubits. Control and readout of these qubits are achieved through bulky commercial-of-the-shelf (COTS) components and room temperature electronics. However, this approach cannot be scaled to tens-of-thousands or millions of qubits required in the future quantum computers. Within the control and readout chains, microwave passive components such as circulators, isolators, filters and hybrid couplers are ubiquitously used and these components occupy significant real-estate within the dilution refrigerator (DL). Recognizing the need for miniaturized, monotonically integrated cryogenic passive devices, research efforts have been made to realize on-chip reciprocal passive devices such as phase shifters and couplers. Lorentz reciprocity has to be broken to realize non-reciprocal components such as circulators and isolators and are traditionally realized using ferrites.

Non-Reciprocal (NR) components such as circulators and isolators are commonly used in current-day superconducting quantum computing systems. Traditionally, these NR devices are implemented using exotic ferrite materials that cannot be integrated into traditional semiconductor fabrication, thereby resulting in large form factors and expensive implementation costs for these devices. Additionally, this also greatly limits the usage of these devices in conjunction with on-chip qubits. Prior non-magnetic, cryogenic circulator implementations were based on parametric frequency-conversion and synthetic rotation principles.

The concept of spatio-temporal modulation (STM) in coupled resonators was introduced to realize on-chip circulators for wireless systems. Later, this concept was translated to realize isolating bandpass filters at RF where varactors were used as the modulating element.

Accordingly, it is desired to develop improved technologies for dealing with qubits and quantum computing.

BRIEF DESCRIPTION

In one aspect, a device for implementing a non-reciprocal bandpass filter is provided. The device includes a plurality of capacitively-coupled shunt resonators. Each capacitively-coupled shunt resonators includes a plurality of superconducting quantum interference devices (SQUIDs) connected to each other. Each capacitively-coupled shunt resonators also includes a flux line inductively coupled to the plurality of SQUIDs. Each capacitively-coupled shunt resonators includes a capacitor connected in parallel to the plurality of SQUIDs.

In another aspect, a capacitively-coupled shunt resonator. The resonator includes a plurality of superconducting quantum interference devices (SQUIDs) connected to each other. The resonator also includes a flux line inductively coupled to the plurality of SQUIDs. The resonator further includes connecting a capacitor connected in parallel to the plurality of SQUIDs.

In a further aspect, a method of manufacture for a non-reciprocal bandpass filter. The method includes aligning plurality of capacitively-coupled shunt resonators in wired connection with each other. Each capacitively-coupled shunt resonators is manufactured by connecting ten superconducting quantum interference devices (SQUIDs) connected to each other in a chain. Each capacitively-coupled shunt resonators is also manufactured by aligning a flux line to be inductively coupled to the plurality of SQUIDs, such that the flux line controls operation of each SQUID through the inductance generated. Each capacitively-coupled shunt resonators is further manufactured by connecting a finger capacitor connected in parallel to the plurality of SQUIDs.

Advantages will become more apparent to those skilled in the art from the following description of the preferred embodiments which have been shown and described by way of illustration. As will be realized, the present embodiments may be capable of other and different embodiments, and their details are capable of modification in various respects. Accordingly, the drawings and description are to be regarded as illustrative in nature and not as restrictive.

BRIEF DESCRIPTION OF THE DRAWINGS

The Figures described below depict various aspects of the systems and methods disclosed therein. It should be understood that each Figure depicts an embodiment of a particular aspect of the disclosed systems and methods, and that each of the Figures is intended to accord with a possible embodiment thereof. Further, wherever possible, the following description refers to the reference numerals included in the following Figures, in which features depicted in multiple Figures are designated with consistent reference numerals.

There are shown in the drawings arrangements which are presently discussed, it being understood, however, that the present embodiments are not limited to the precise arrangements and are instrumentalities shown, wherein.

The Figures depict preferred embodiments for purposes of illustration only. One skilled in the art will readily recognize from the following discussion that alternative embodiments of the systems and methods illustrated herein may be employed without departing from the principles of the invention described herein.

DETAILED DESCRIPTION

This disclosure describes the concept and implementation of a superconducting non-reciprocal bandpass filter that combines the functionalities of a conventional bandpass filter with an isolator leveraging the concept of spatio-temporal modulation in coupled resonator networks. This disclosure also enables the integration of superconducting non-reciprocal bandpass filters on-chip, thereby greatly reducing their implementation cost and form factor. Additionally, the on-chip integration opens doors to new system architectures that were otherwise non-possible with off-the-shelf components such as ferrites-based non-reciprocal components.

As described herein, parametric modulation within the resonators is achieved through the inductance modulation using SQUIDs (superconducting quantum interference device) as the modulating elements. A SQUID is a very sensitive magnetometer used to measure extremely weak magnetic fields, based on superconducting loops containing Josephson junctions. When operating at a base temperature of 20 mK, the non-reciprocal bandpass filter exhibits a low transmission loss of 1.3 dB in one direction while providing isolation of +25 dB in the reverse direction. Through DC flux tuning, the center frequency of the filter can be tuned from 6 GHz to 6.75 GHz.

A non-magnetic, fully-integrated, superconducting non-reciprocal bandpass filter using spatio-temporal inductance modulation in coupled resonator networks is presented herein. This combines the functionalities of a conventional bandpass filter with an isolator. The bandpass filter is based on a capacitively-coupled shunt resonator architecture where the resonators are implemented as a parallel combination of finger capacitors and a chain of 10 SQUIDs which behave as flux-controlled nonlinear inductors. The operation principle of the device is optimized for non-reciprocal performance using Floquet spectral analysis where the time-modulated SQUIDs are modeled using frequency translational admittance matrices. The bandpass filter is implemented in a single-layer superconducting process. When operating at a base temperature of 20 mK, the non-reciprocal bandpass filter exhibits a low transmission loss of 1.3 dB in one direction while providing isolation of +25 dB in the reverse direction. Through DC flux tuning, the center frequency of the filter can be tuned from 6 GHz to 6.75 GHz.

Figure 1:
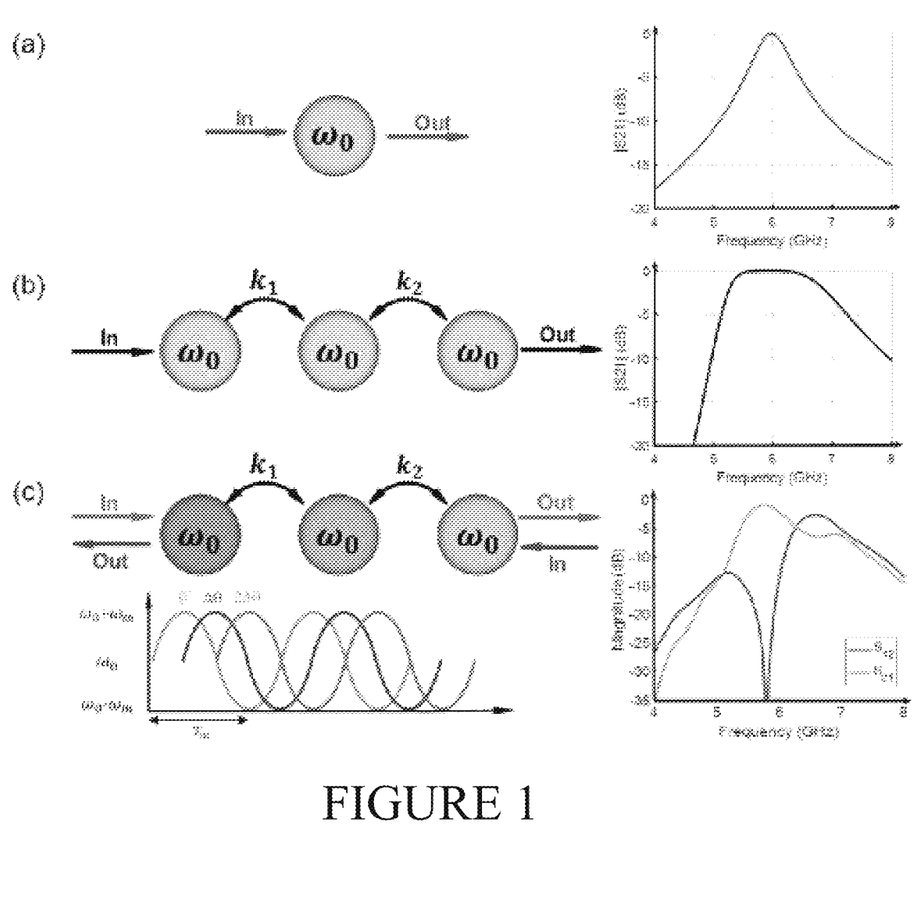
FIGS. 1A-1C illustrate an exemplary conceptual evolution of a non-reciprocal bandpass filter from conventional bandpass resonators, in accordance with at least one embodiment of the disclosure.
Figure 2A:
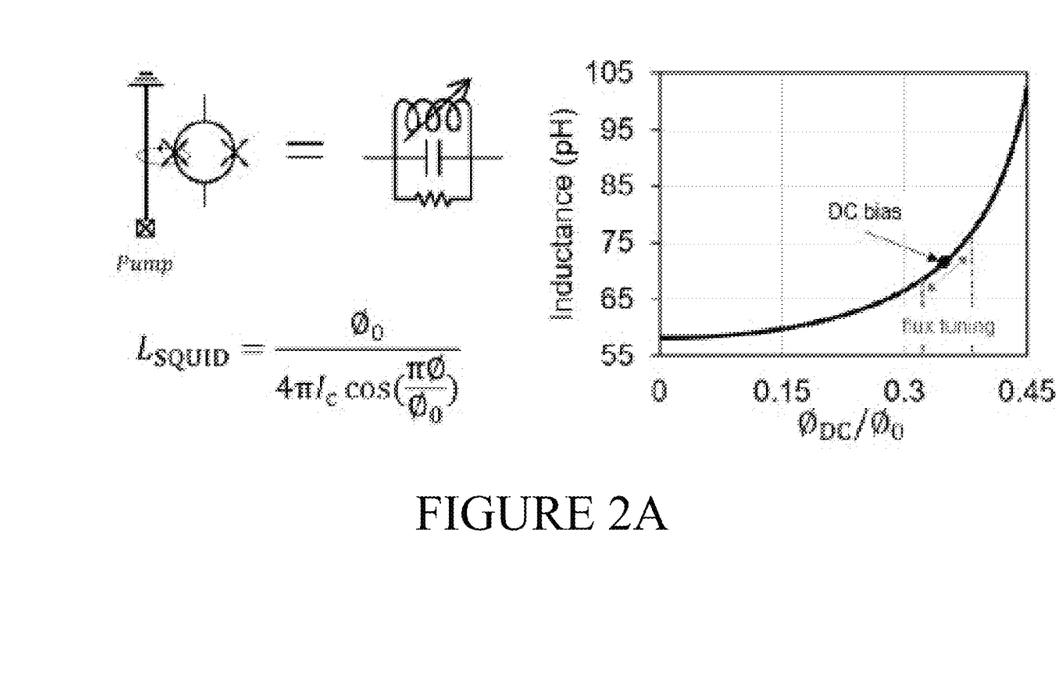
FIG. 2A illustrates an exemplary circuit model of a SQUID (superconducting quantum interference device) and variation of SQUID inductance as a function of the flux threaded through the SQUID loop.

FIGS. 1A-1C illustrate an exemplary conceptual evolution of a non-reciprocal bandpass filter from conventional bandpass resonators, in accordance with at least one embodiment of the disclosure. More specifically, FIG. 1A illustrates an exemplary unmodulated microwave resonator and its transmission response. FIG. 1B illustrates an unmodulated coupled microwave resonator network featuring higher order filtering response. FIG. 1C illustrates the concept of spatio-temporal modulation in coupled resonators featuring non-reciprocal transmission response Josephson Junctions (JJs) are superconducting devices that are fabricated by sandwiching an insulating barrier between two superconducting islands. Two JJs can be placed in parallel to form a loop called a DC SQUID (direct current superconducting quantum interference device). The inductance of a DC SQUID can be controlled by the magnetic flux threading the junction loop as shown in FIG. 2A. Neglecting the geometric loop inductance, the inductance of an N stacked SQUID array as function of the magnetic flux can be expressed as:

$$L_{SQUID,N} = \frac{N\Phi_0}{4\pi I_C \cos\left(\frac{\pi\Phi}{\Phi_0}\right)} \qquad \text{EQ. 1}$$

where N is the number of SQUID loops that are stacked, $\Phi_0 \approx 2.06 \times 10^{-15}$ Wb is the flux quantum, $I_C$ represents the critical current of the JJs used in the SQUID loop and $\Phi$ represents the magnetic flux that is threaded through each of the SQUID loops. The flux $\Phi$ can be realized by passing current through a flux line that is inductively coupled with the SQUID loops ($\Phi = M^* I_{feed}$ where M represents the mutual coupling between the feed line and the SQUID loop). Therefore, the inductance of the SQUID can be modulated by passing periodically time-varying current through the feed line. Consequently, the resonant frequency of an LC, resonator implemented as a SQUID parallel with a capacitor, can also be modulated using a modulating current in the feed line.

Figure 2B:
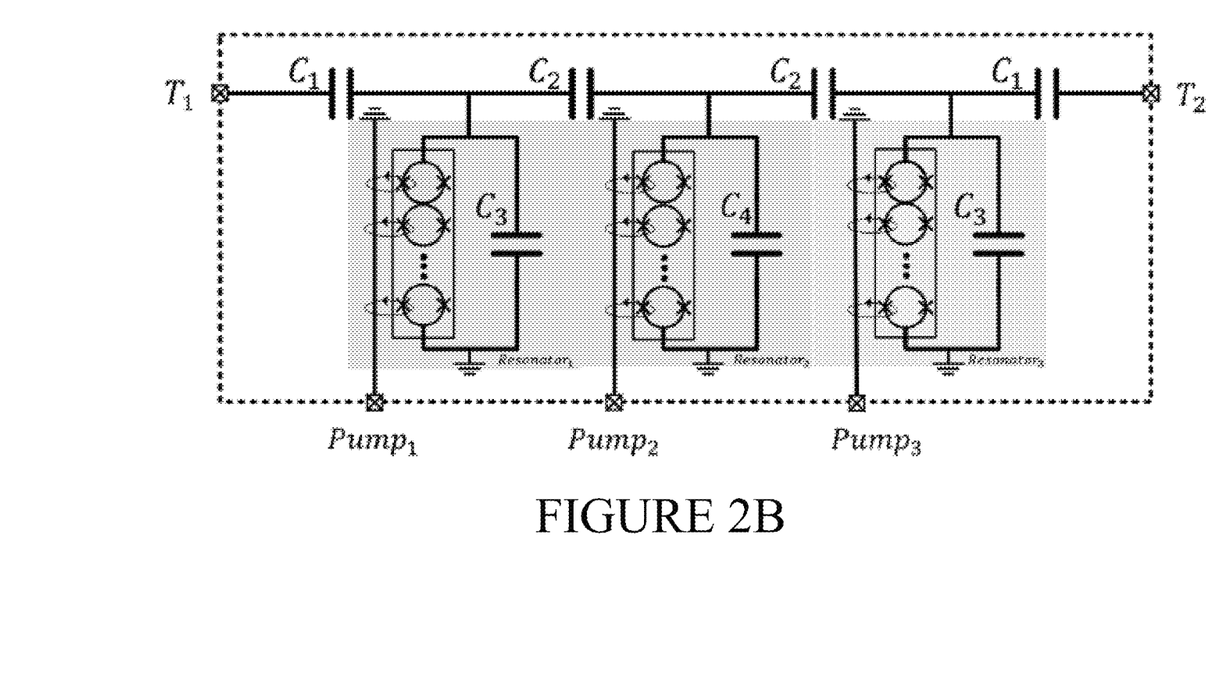
FIG. 2B illustrates an exemplary circuit diagram of a non-reciprocal bandpass filter implemented using a capacitively-coupled shunt resonator topology.

FIG. 2A illustrates an exemplary circuit model of a SQUID (superconducting quantum interference device) and variation of SQUID inductance as a function of the flux threaded through the SQUID loop. FIG. 2B illustrates an exemplary circuit diagram of a non-reciprocal bandpass filter implemented using a capacitively-coupled shunt resonator topology.

FIG. 2B illustrates a capacitively-coupled shunt resonator architecture to implement the non-reciprocal bandpass filter. The resonators are implemented as a parallel combination of finger capacitors and a chain of 10 SQUIDs. Increasing the number of cascaded SQUIDs enables the use of JJs with larger critical currents while achieving the same inductance, thus increasing the power handling and linearity of the non-reciprocal bandpass filter. The non-reciprocal operation of the filter can be understood through the spectral path taken by the incident signal. In an unmodulated case, the incident signal in both directions enters the filter, traverses through the individual resonators, and finally exits the filter at input frequency $f_{in}$, thus resulting in a reciprocal response. However, in the time-modulated case, a part of the input signal is translated to the intermodulation (IM) frequencies ($f_{in} \pm f_m$) by the first and second resonators. The IM products are re-constructed back to the input frequency by the second and the third resonators. The progressive phase shift induced within the resonator pump signals, as shown in FIG. 1C (optimal θ=90° for a 3rd order bandpass filter), results in a direction-dependent phase shift during the frequency translation from input frequency to the IM frequencies and vice-versa. Due to this direction-dependent phase shift, the signals translated back to the input frequency are constructively added in the forward (left-to-right) direction resulting in low insertion loss, while they add-up destructively in the reverse (right-to-left) direction thus resulting in high isolation.

To build the non-reciprocal bandpass filter, a conventional bandpass filter is designed for low loss and high out-of-band filtering with $I_C=4$ µA, $\Phi_{DC}=0.35\Phi_0$, and the capacitors $C_1=257$ fF, $C_2=113$ fF, $C_3=232$ fF, and $C_4=284$ fF. Then a sinusoidal modulation with progressive phase shifts is imparted to the feed currents to achieve non-reciprocal response, i.e., $\Phi_{feed,i}=\Phi_{DC}+\Delta\Phi \cos(\omega_m t+(i-1)*\theta)$ where i represents the resonator number from left to right. The filter performance is optimized across the parameter space of $\Delta\Phi$, $\omega_m$, $\theta$ and $\Phi_{DC}$ for low insertion loss in the forward direction and high isolation in the reverse direction using the Floquet spectral analysis. For an optimal modulation condition of $(\Phi_{DC}/\Phi_0)=0.35$, $\Delta\Phi=0.024\Phi_0$, $f_m=700$ MHz, and $\theta=90°$, at a center frequency of 6 GHz, the filter exhibits an insertion loss of 0.6 dB in the forward direction and an isolation of >25 dB in the reverse direction. Additionally, the center frequency of the non-reciprocal bandpass filter can be tuned by varying the DC flux bias of the SQUID loops.

In the exemplary embodiment, the non-reciprocal bandpass filter is fabricated in a single-layer aluminum process. The JJs are fabricated by the Dolan bridge technique using conventional lift-off process patterned by electron-beam lithography on a bi-layer resist stack with an insulator thickness of 2 nm to 5 nm. The JJs are designed for a critical current of 4 µA with a critical current density of 2 µA/µm². Each SQUID loop is designed with a conductor width of 4 µm and occupies a total area of 16 µm×16.5 µm with an area of 8 µm×8.5 µm for the inner cavity. The EM simulated geometric loop inductance of the SQUIDs is 12 pH that is ≈20% of the SQUID inductance at zero flux bias. The capacitors within the design are realized using conventional fingered-capacitor layout. The core non-reciprocal band pass filter occupies a total area of 3 mm×1 mm. The input/output (IO) and the pump signals are interfaced to the chip edge using co-planar waveguide launchers.

In the exemplary embodiment, the bandpass filter is wirebonded to a printed circuit board (PCB) and is mounted in a copper package. The I0 terminals of the bandpass filter and the three pump lines are connected to five of the eight RF lines within the copper package. The copper package is then mounted inside the dilution refrigerator and is surrounded by a cryoperm shielding. In at least one embodiment, the device is cooled down to a base temperature of 20 mK. The I0 terminals of the bandpass filter are interfaced with the probe and readout lines of the dilution refrigerator through two shape memory alloy (SMA) latch transfer switches. A through line is also connected between the remaining ports of these switches to characterize the transmission loss and/or gain of the probe and the readout lines within the dilution refrigerator.

A current formula for the three resonators from left to right can be expressed as:

$$I_{DC} + I_{pump}\sin(\omega_m t + \theta_1)$$

$$I_{DC} + I_{pump}\sin(\omega_m t + \theta_2)$$

$$I_{DC} + I_{pump}\sin(\omega_m t + \theta_3)$$

Figure 3:
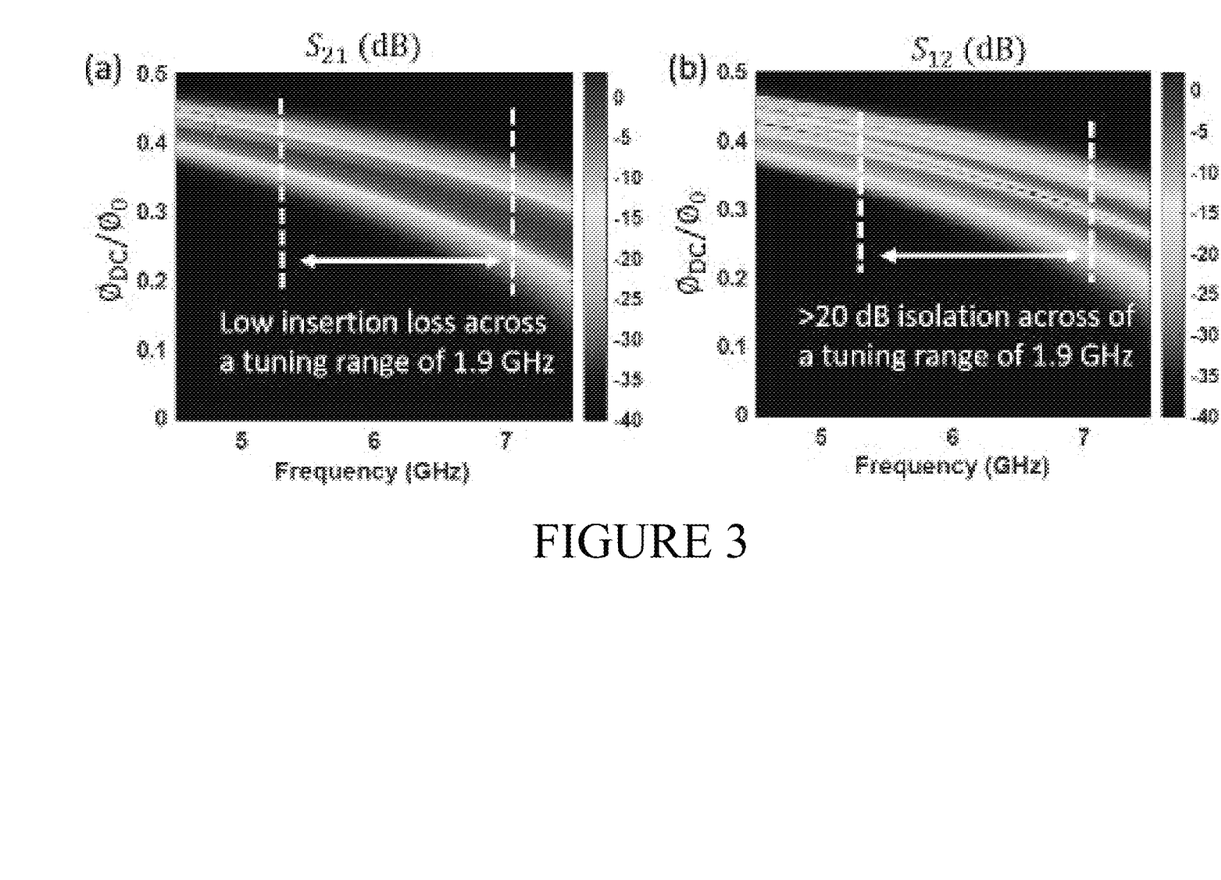
FIGS. 3A and 3B illustrates theoretically calculated isolation and transmission of the non-reciprocal bandpass filed across varying $\Phi_{DC}$.

FIGS. 3A and 3B illustrates theoretically calculated isolation and transmission of the non-reciprocal bandpass filed across varying $\Phi_{DC}$. More specifically, FIG. 3A illustrates theoretically calculated isolation and transmission (S12) across varying ADC showing a center frequency tuning from 5.2 GHz to 7.1 GHz while achieving sub-1 dB insertion loss and >20 dB isolation. FIG. 3B illustrates theoretically calculated isolation and transmission (S12) across varying ADC showing a center frequency tuning from 5.2 GHz to 7.1 GHz while achieving sub-1 dB insertion loss and >20 dB isolation.

Figure 4A:
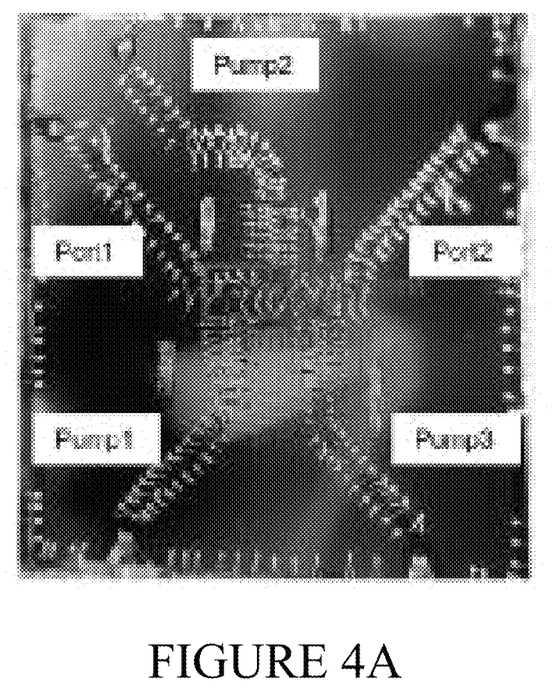
FIG. 4A illustrates an exemplary chip microphotograph of the fabricated non-reciprocal bandpass filter.
Figure 4B:
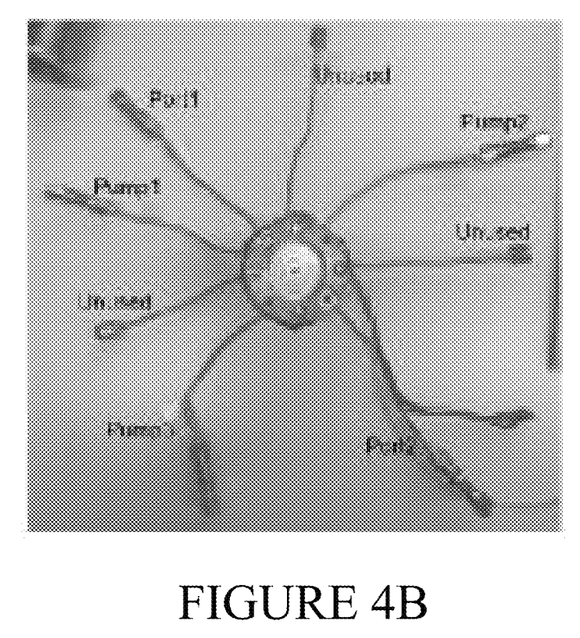
FIG. 4B illustrates an exemplary copper package to which the chip is wirebonded.
Figure 4C:
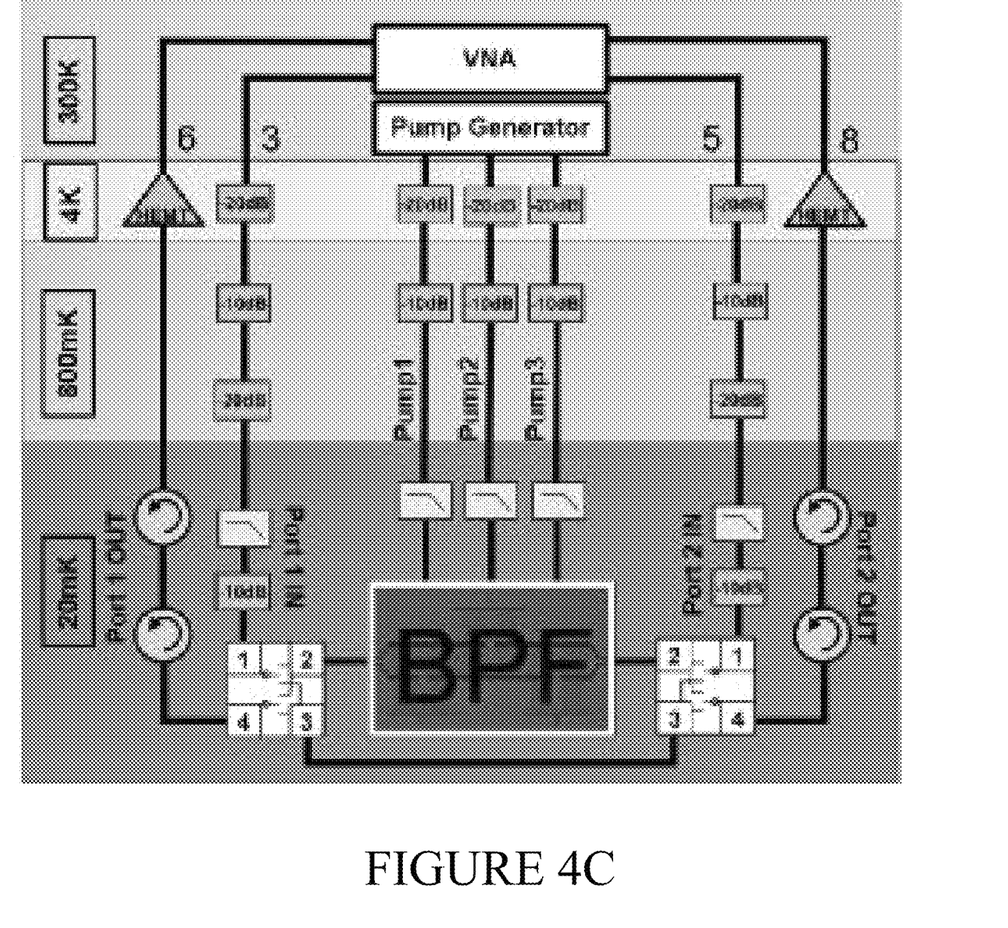
FIG. 4C illustrates an exemplary measurement block diagram of the exemplary setup of the non-reciprocal bandpass filter described herein.

FIG. 4A illustrates an exemplary chip microphotograph of the fabricated non-reciprocal bandpass filter. FIG. 4B illustrates an exemplary copper package to which the chip is wirebonded. FIG. 4C illustrates an exemplary measurement block diagram of the exemplary setup of the non-reciprocal bandpass filter described herein.

Figure 5A:
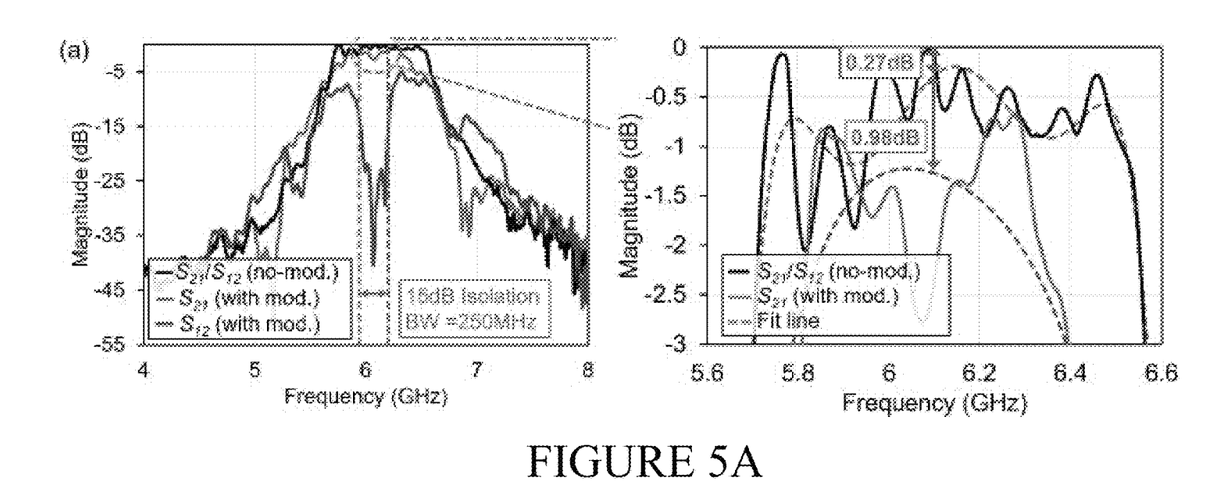
FIG. 5A illustrates graphs of measured scattering parameters of the non-reciprocal bandpass filter after normalizing with the transmission loss of the through structure.

FIG. 5A illustrates graphs of measured scattering parameters of the non-reciprocal bandpass filter after normalizing with the transmission loss of the through structure. The measured transmission loss of the filter with no-modulation is 0.27 dB. When flux-pumping is applied to achieve non-reciprocity, an additional insertion loss of 0.98 dB in the forward direction was measured. The measured isolation is +25 dB at the center frequency and is >15 dB across 250 MHz bandwidth in the reverse direction.

Figure 5B:
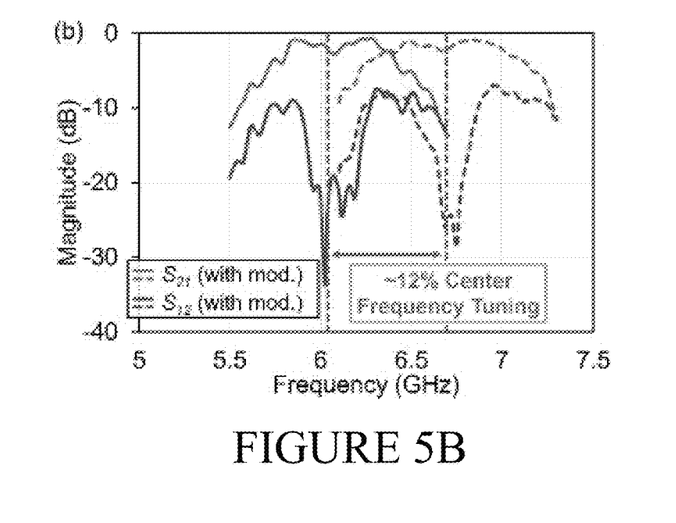
FIG. 5B illustrates a graph of leveraging the DC flux bias to tune the center frequency of the bandpass filter from 6 GHz to 6.75 GHz.

FIG. 5B illustrates a graph of leveraging the DC flux bias to tune the center frequency of the bandpass filter from 6 GHz to 6.75 GHz. Any small ripple in the transmission response due to the mismatches within the probe and readout lines, can be avoided by employing a full 2-port characterization.

Figure 6A:
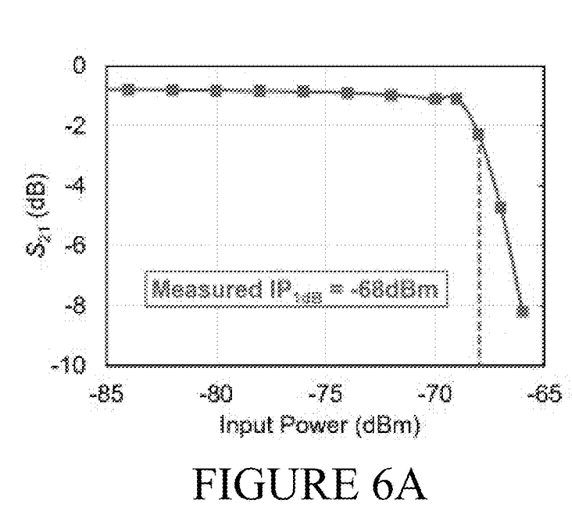
FIG. 6A illustrates a graph of the transmission loss of the filter across varying input powers.

FIG. 6A illustrates a graph of the transmission loss of the filter across varying input powers. In FIG. 6A, the −1 dB compression point is measured to be −68 dBm. That is several orders of magnitude larger than the typical power used to readout/control the superconducting qubits.

Figure 6B:
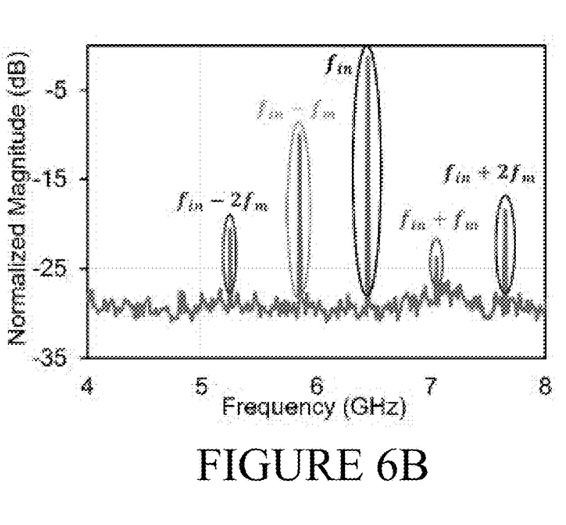
FIG. 6B illustrates a graph of Normalized output spectra in the forward direction.
Figure 6C:
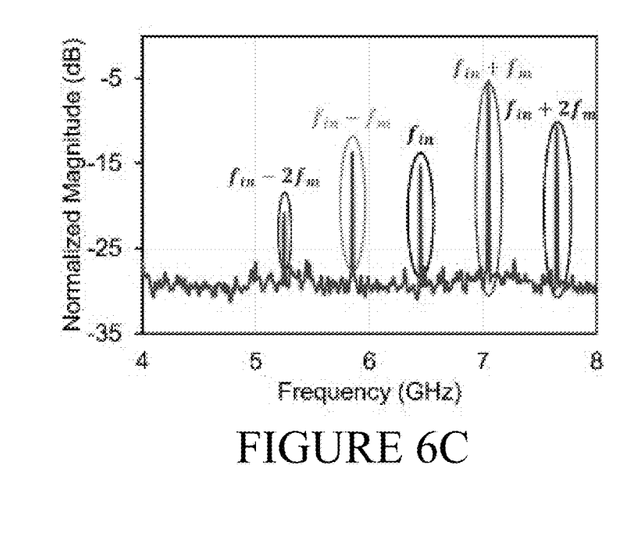
FIG. 6C illustrates a graph of Normalized output spectra in the reverse directions.

FIG. 6B illustrates a graph of Normalized output spectra in the forward direction. FIG. 6C illustrates a graph of Normalized output spectra in the reverse directions. As it can be seen, in the transmission direction, most of the input power is concentrated at the input frequency, thus representing low insertion loss. In the reverse direction, however, the input power is translated to intermodulation frequencies resulting in high isolation. Reducing the signal power translation to IM frequencies and consequently reducing the harmonic losses through differential bandpass filter architecture similar to the differential STM-biased circulators.

The superconducting non-reciprocal bandpass filter described herein is based on the concept of spatio-temporal inductance modulation in coupled resonators. The proposed architecture is analyzed using Floquet spectral analysis and the optimal modulation parameters were found for low insertion loss and high isolation around the center frequency. One implementation includes a capacitively-coupled, 3-resonator based non-reciprocal bandpass filter in an in-house single-layer fabrication process. The non-reciprocal filter measures a low transmission loss of 1.3 dB in the forward direction while achieving an isolation loss of >15 dB across a bandwidth of 250 MHz.

ADDITIONAL CONSIDERATIONS

Description above gives in detail a non-reciprocal filter according to the exemplary embodiments, with reference to the accompanying drawings. Hereinafter, suffixes "module" and "unit or portion" for components used herein in description are merely provided only for facilitation of preparing this specification, and thus they are not granted a specific meaning or function. Hence, it should be noticed that "module" and "unit or portion" can be used together. For the sake of brief description with reference to the drawings, the same or equivalent components will be provided with the same reference numbers, and description thereof will not be repeated. The expression in the singular form in this specification will cover the expression in the plural form unless otherwise indicated obviously from the context.

It will be apparent to those skilled in that art that various modifications and variations can be made in the fabrication and configuration of the present invention without departing from the scope and spirit of the invention. For example, the design of the present invention is scalable.

As used herein, an element or step recited in the singular and proceeded with the word "a" or "an" should be understood as not excluding plural elements or steps, unless such exclusion is explicitly recited. Furthermore, references to "example" or "one example" of the present disclosure are not intended to be interpreted as excluding the existence of additional examples that also incorporate the recited features. Further, to the extent that terms "includes," "including," "has," "contains," and variants thereof are used herein, such terms are intended to be inclusive in a manner similar to the term "comprises" as an open transition word without precluding any additional or other elements.

Furthermore, as used herein, the term "real-time" refers to at least one of the time of occurrence of the associated events, the time of measurement and collection of predetermined data, the time to process the data, and the time of a system response to the events and the environment. In the examples described herein, these activities and events occur substantially instantaneously.

The patent claims at the end of this document are not intended to be construed under 35 U.S.C. § 112(f) unless traditional means-plus-function language is expressly recited, such as "means for" or "step for" language being expressly recited in the claim(s).

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A device for implementing a non-reciprocal bandpass filter comprising a plurality of capacitively-coupled shunt resonators, wherein each capacitively-coupled shunt resonators comprises:
   a plurality of superconducting quantum interference devices (SQUIDs) connected to each other;
   a flux line inductively coupled to the plurality of SQUIDs; and
   a capacitor connected in parallel to the plurality of SQUIDS,
   wherein a sinusoidal modulation with progressive phase shifts is imparted to one or more feed currents to achieve a non-reciprocal response.

2. The device of claim 1, wherein the plurality of SQUIDs are connected in a chain configuration.

3. The device of claim 1, wherein the plurality of SQUIDs include ten SQUIDs in a chain configuration.

4. The device of claim 1, wherein each SQUID of the plurality of SQUIDs is a DC (direct current) SQUID.

5. The device of claim 1, wherein each SQUID of the plurality of SQUIDs comprises two Josephson Junctions (JJs) in parallel.

6. The device of claim 1, wherein the plurality of SQUIDs are inductively coupled to the flux line.

7. The device of claim 6, wherein the flux line 1 influences the plurality of SQUIDs by emitting magnetic flux that threads through a junction loop of each SQUID.

8. The device of claim 7, wherein the flux line controls operation of each SQUID through the inductance generated.

9. The device of claim 1, wherein the device comprises a bandpass filter configured for low loss and high out-of-band filtering.

10. The device of claim 1, wherein filter performance is optimized across parameter space for low insertion loss in a forward direction and high isolation in a reverse direction.

11. The device of claim 1, wherein the non-reciprocal bandpass filter comprises Josephson Junctions (JJs) fabricated by a Dolan bridge technique using conventional lift-off process patterned by electron-beam lithography on a bi-layer resist stack.

12. The device of claim 1, wherein the device is cooled to a base temperature of 20 mK for operation.

13. The device of claim 1, wherein the capacitor is a finger capacitor.

14. The device of claim 1, wherein the plurality of capacitively-coupled shunt resonators comprises three resonators.

15. The device of claim 1, wherein the device is used in quantum computing.

16. A capacitively-coupled shunt resonator comprising:
   a plurality of superconducting quantum interference devices (SQUIDs) connected to each other;
   a flux line inductively coupled to the plurality of SQUIDs; and
   connecting a capacitor connected in parallel to the plurality of SQUIDS,
   wherein a sinusoidal modulation with progressive phase shifts is imparted to one or more feed currents to achieve a non-reciprocal response.

17. The resonator of claim 16, wherein the plurality of SQUIDs include ten SQUIDs in a chain configuration, wherein each SQUID of the plurality of SQUIDs is a DC (direct current) SQUID, and wherein each SQUID of the plurality of SQUIDs comprises two Josephson Junctions (JJs) in parallel.

18. The resonator of claim 16, wherein the flux line influences the plurality of SQUIDs by emitting magnetic flux that threads through a junction loop of each SQUID.

19. A method of manufacture for a non-reciprocal bandpass filter comprising aligning plurality of capacitively-coupled shunt resonators in wired connection with each other, wherein each capacitively-coupled shunt resonators is manufactured by:
   connecting ten superconducting quantum interference devices (SQUIDs) connected to each other in a chain;
   aligning a flux line to be inductively coupled to the plurality of SQUIDs, such that the flux line controls operation of each SQUID through the inductance generated; and connecting a finger capacitor connected in parallel to the plurality of SQUIDS,
wherein a sinusoidal modulation with progressive phase shifts is imparted to one or more feed currents to achieve a non-reciprocal response.

20. The method of claim 19, wherein the plurality of SQUIDs include ten SQUIDs in a chain configuration, wherein each SQUID of the plurality of SQUIDs is a DC (direct current) SQUID, and wherein each SQUID of the plurality of SQUIDs comprises two Josephson Junctions (JJs) in parallel.

\* \* \* \* \*